(12) United States Patent
Elia

(10) Patent No.: US 7,932,780 B2
(45) Date of Patent: Apr. 26, 2011

(54) METHOD FOR IMPLEMENTATION AND PARAMETER SETTINGS OF A VOLTAGE ENHANCEMENT CIRCUIT FOR AMPLIFIERS AS AN INTEGRATED CIRCUIT (IC)

(75) Inventor: Avner Elia, Ramat Ishai (IL)

(73) Assignee: Paragon Communications Ltd., Haifa (IL)

( * ) Notice: Subject to any disclaimer, the term of this patent is extended or adjusted under 35 U.S.C. 154(b) by 0 days.

(21) Appl. No.: 11/914,748

(22) PCT Filed: May 21, 2006

(86) PCT No.: PCT/IL2006/000598
§ 371 (c)(1),
(2), (4) Date: Dec. 31, 2007

(87) PCT Pub. No.: WO2006/123350
PCT Pub. Date: Nov. 23, 2006

(65) Prior Publication Data
US 2009/0278605 A1    Nov. 12, 2009

(51) Int. Cl.
*H03F 3/16* (2006.01)
(52) U.S. Cl. ......... 330/277; 330/136; 330/285; 330/297
(58) Field of Classification Search .................. 330/127, 330/129, 136, 277, 285, 297, 307
See application file for complete search history.

(56) References Cited

U.S. PATENT DOCUMENTS

| | | | |
|---|---|---|---|
| 6,437,641 B1 | 8/2002 | Bar-David | |
| 6,492,867 B2 * | 12/2002 | Bar-David | 330/136 |
| 6,566,944 B1 | 5/2003 | Pehlke | |
| 6,831,519 B2 | 12/2004 | Bar-David | |
| 6,985,039 B2 * | 1/2006 | Bar-David et al. | 330/297 |
| 7,193,470 B2 * | 3/2007 | Lee et al. | 330/285 |
| 7,405,618 B2 * | 7/2008 | Lee et al. | 330/297 |
| 7,420,415 B2 * | 9/2008 | Lee et al. | 330/136 |
| 2002/0153940 A1 | 10/2002 | Wurcer | |
| 2004/0251968 A1 | 12/2004 | Bar-David | |
| 2005/0057308 A1 | 3/2005 | Veinblat | |

FOREIGN PATENT DOCUMENTS

| | | |
|---|---|---|
| EP | 0963039 A1 | 12/1999 |
| EP | 0969593 A | 1/2000 |
| GB | 2279779 A | 1/1995 |
| WO | WO02097972 A2 | 12/2002 |

* cited by examiner

*Primary Examiner* — Khanh V Nguyen
(74) *Attorney, Agent, or Firm* — Marsteller & Associates, P.C.

(57) ABSTRACT

Voltage Enhancement Circuitry (VEC) for amplifiers, suitable of being implemented as an Integrated Circuit (IC), that comprises a VEC driver with a low output resistance (Rdson) while being in its inactive mode and a linearly increasing resistance that is changing linearly with the input control signal, while entering into its active mode, above a determined threshold; external contacts in the VEC, for connecting, whenever required, external feedback elements across the contacts; an external feedback loop connected to an input of the VEC driver, for sensing changes in the enhancement power; a threshold programming module, for externally programming and determining a threshold level for the input signal, above which enhancement is provided shaping the amplified video envelope pulse; an I-Boost module for sampling the amplitude of the video envelope input current and for amplifying the input current up to a pre-defined level; and a current controlled bias circuit for shifting, whenever required, the bias of the lower and/or of the upper valves of the VEC driver.

7 Claims, 8 Drawing Sheets

METHOD FOR IMPLEMENTATION AND PARAMETER SETTINGS OF A VOLTAGE ENHANCEMENT CIRCUIT FOR AMPLIFIERS AS AN INTEGRATED CIRCUIT (IC)

FIELD OF THE INVENTION

The present invention relates to the field of power amplifiers. More particularly, the invention relates to a method and apparatus for implementing a Voltage Enhancement Circuit (VEC™) circuit as an Integrated Circuit (IC).

BACKGROUND OF THE INVENTION

The technique of eXcess eNvelope eNhancement (XNN®) for power amplifiers (PA) is a simplified type of Envelope Tracking (ET), which is a solution for efficient enhancement and power boost of WiFi and WiMAX power amplifiers, as disclosed by U.S. Pat. No. 6,437,641.

A Voltage Enhancement Circuit (VEC™), as disclosed, for example, in U.S. Pat. No. 6,831,519 modulates the supply voltage of power amplifiers as part of the XNN® solution. Appropriate modulation of the supply voltage prevents saturation of power amplifiers while amplifying signals that exceed a predefined programmable threshold. However, the implementation of the circuits disclosed in the above patents are more suitable for using discrete components.

All the methods described above have not yet provided satisfactory solutions to the problem of providing robust implementation a VEC™ in a VLSI chip while overcoming the manufacturing process variations and the chip interactions with other PA system parts.

It is an object of the present invention to propose a method and circuitry for providing robust implementation a VEC™ in a VLSI chip, while overcoming problems that are related to manufacturing process variations and the chip's interactions with other PA system parts.

It is another object of the present invention to propose a method for providing an implementation of a VEC™ in a VLSI chip, while maintaining a relatively fast response time.

Other objects and advantages of the invention will become apparent as the description proceeds.

SUMMARY OF THE INVENTION

The present invention is directed to a Voltage Enhancement Circuitry (VEC) for amplifiers, suitable of being implemented as an Integrated Circuit (IC), that comprises:
a) a VEC driver with a low output resistance (Rdson) while being in its inactive mode and a linearly increasing resistance that is changing linearly with the input control signal, while entering into its active mode, above a determined threshold;
b) external contacts in the VEC, for connecting, whenever required, external feedback elements across the contacts;
c) an external feedback loop connected to an input of the VEC driver, for sensing changes in the enhancement power;
d) a threshold programming module, for externally programming and determining a threshold level for the input signal, above which enhancement is provided shaping the amplified video envelope pulse;
e) an I-Boost module for sampling the amplitude of the video envelope input current and for amplifying the input current up to a pre-defined level; and
f) a current controlled bias circuit for shifting, whenever required, the bias of the lower and/or of the upper valves of the VEC driver.

The circuitry may further comprise a coupling capacitor and an RF transformer, through which the enhancement power is fed to DC feeding input of the amplifier and/or apparatus for feeding enhancement power to the transformer's primary port through a DC/DC converter and a DC/DC filter. The threshold programming module may further comprise contacts for connecting an external resistor or a programmable current source, for externally adjusting the threshold level.

The Upper Valve (UV) of the VEC driver further may comprise a feedback with components that are implemented externally to the chip that consists of a combination of parallely connected capacitor and resistor, for controlling the gain of the VEC driver by tracking changes in the level of enhancement.

The VEC driver may further comprise two separate fast drive circuits for driving its Lower and Upper Valves through two separate fast drive paths, thereby reducing the response time of the VEC driver with an improved control of the gain of the VEC.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Robust implementation of the VEC™ in a VLSI chip is a major challenge, considering the process variations and the chip interactions with other PA system parts. External adjustment of VEC™ controlled blocks may be used to overcome this problem. This may be performed by passing a small-calibration current from the chip through an adjustment resistor. The voltage drop over this resistor is the regulating parameter that is read by the chip.

Figure 1:
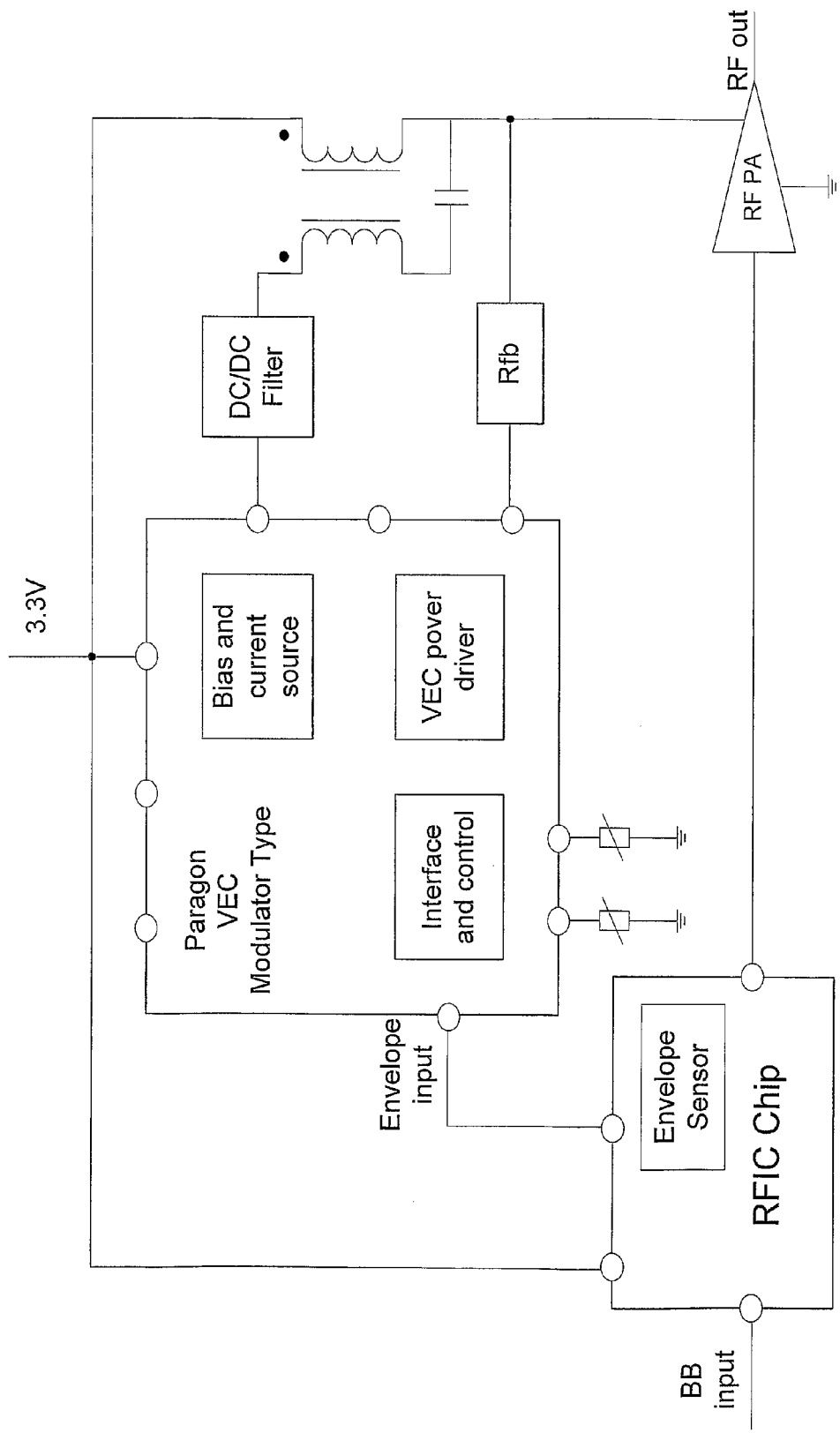
FIG. 1 schematically illustrates a typical implementation of XNN® PA.
Figure 2:
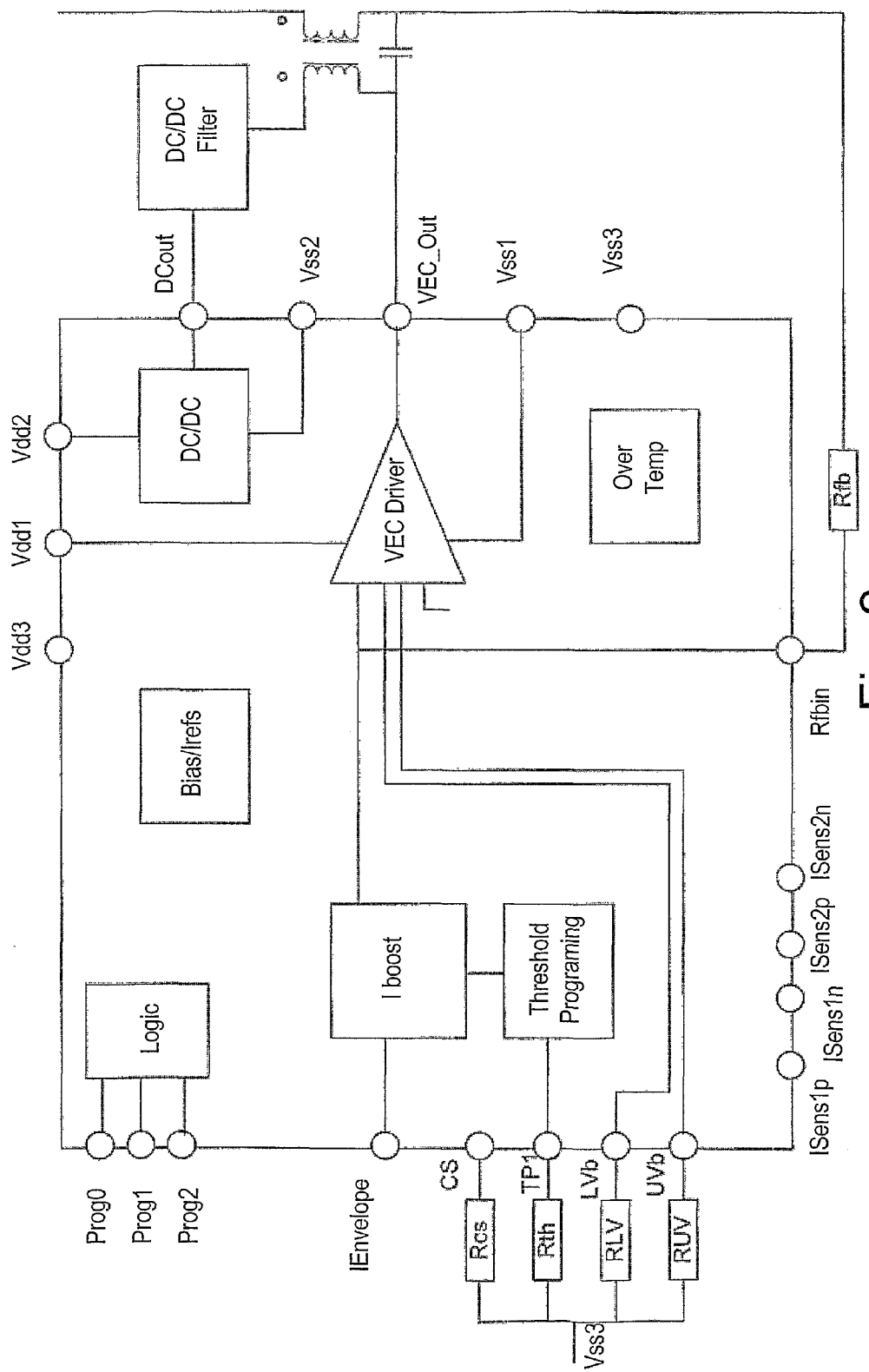
FIG. 2 schematically illustrates the internal block diagram of VEC™ chip.

A typical implementation of XNN® PA is illustrated in FIG. 1 and the internal block diagram of a VEC™ chip is shown in FIG. 2. Several options for VEC™ internal block implementation are shown hereinbelow.

FIG. 2 schematically illustrates the internal block diagram of VEC™ chip, according to an embodiment of the invention. The VEC™ chip includes a VEC driver which contains a push-pull stage that enhances the voltage upon demand and supplies the extra current needed to the PA during the enhancement period. The VEC driver is fed by an I boost circuit, which samples the video envelope amplitude input and amplifies the input current up to a pre-defined level. A threshold-programming circuit is used for shaping the amplified video envelope pulse. The VEC™ chip also includes an output stage and a feedback circuitry Rfb, which is connected between the output stage and an input of the VEC driver, for sensing changes in said output voltage.

VEC™ Chip Implementation

There are several options for EC implementation. They include one configuration called Voltage Enhancement Circuitry (VEC™) using an inductor, or a diode or a FET instead of an inductor. In another and more advanced configuration enhancement is performed using both a voltage and a current source with two inductors, and is called Dual Enhancement Circuitry (DEC). Both VEC and DEC are employed in addition to a crucial coupling capacitor. It was found that the DEC configuration can achieve superior performance, particularly when using two inductors that can be wound on a single core, thus forming a transformer (shown in FIG. 1 and FIG. 2) with 1:1 turn ratio.

The basic VEC™ and the DEC differ mainly in the out-of-chip components. In addition, DEC needs a DC/DC converter as a current source. The basic VEC™ needs a much larger and faster output stage to be able to match the DEC spectral content, Error Vector Magnitude (EVM) and efficiency performance. It is worthwhile to design different chips for each EC option.

In a basic VEC™ chip the current of the output stage's upper transistor called the Upper Valve (UV) should be twice as specified. A DEC chip can be implemented using conventional 0.5 μm CMOS technology. The DC/DC block as well as the DC/DC filter and inductor can be sometimes omitted. Implementing this chip may require more advanced technology, such as BiCMOS, SiGe or GaAs.

Internal Block Typical Implementation

I-Boost

Figure 3:
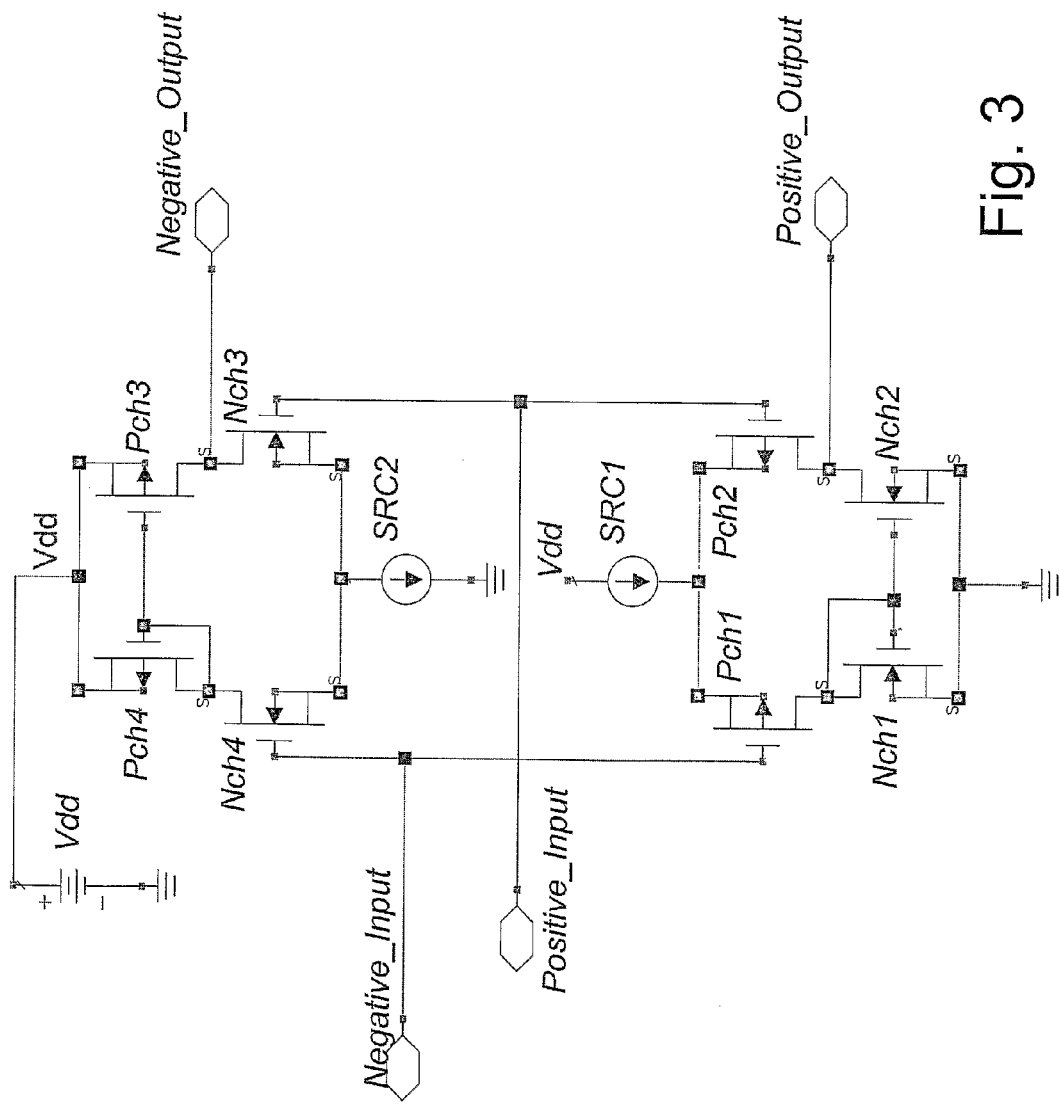
FIG. 3 schematically illustrates an implementation of an I-Boost circuit, according to a preferred embodiment of the invention.

FIG. 3 schematically illustrates an implementation of an I-Boost circuit, according to a preferred embodiment of the invention. The I-Boost samples the video envelope amplitude input. The boost circuit amplifies the input current up to a pre-defined level. Gain control of the I-Boost block allows using a range of input currents. That is also equivalent to setting a desired threshold. A current, proportional to the video envelope value, may be injected into the I-Boost input from an open collector (or open drain) output, or from another current source or current sink, such as a current output of a Digital To Analogue Converter (DAC).

Threshold Programming

Figure 4:
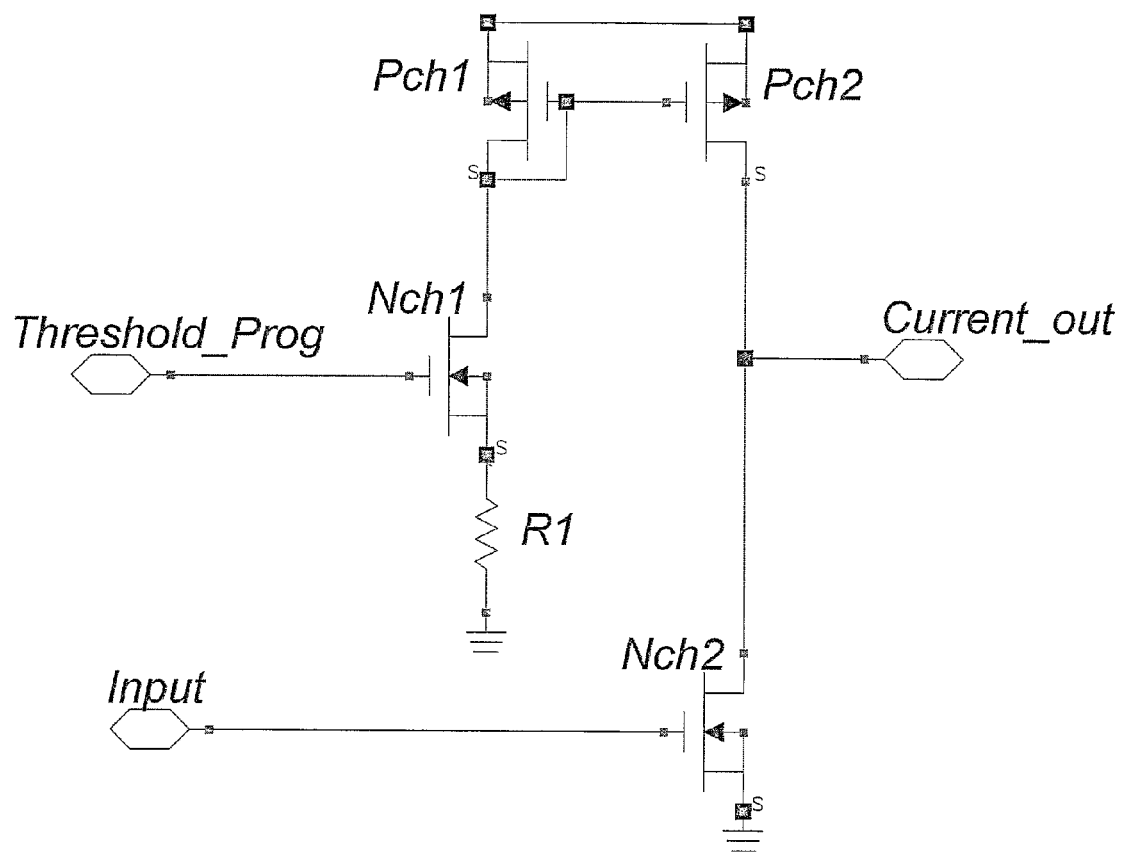
FIG. 4 schematically illustrates an implementation of a threshold-programming circuit, according to a preferred embodiment of the invention.

FIG. 4 describes one implementation of a threshold-programming circuit, according to a preferred embodiment of the invention. Threshold programming is used for shaping the amplified video envelope pulse. The threshold level may be controlled to optimize system performance using minimum Bit Error Rate (BER), maximum efficiency, etc., as optimization parameters. The threshold level may be adjusted using an external resistor or programmable current source.

DC Biases and Control

The discrete implementation of the VEC™ chip contains some AC coupling capacitors. Those capacitors are too large for a VLSI implementation and cannot be implemented inside the chip. In addition, they may cause memory effects that influence system performance. Therefore, elimination of those capacitors is required, for example by using current controlled bias circuits.

Figure 5:
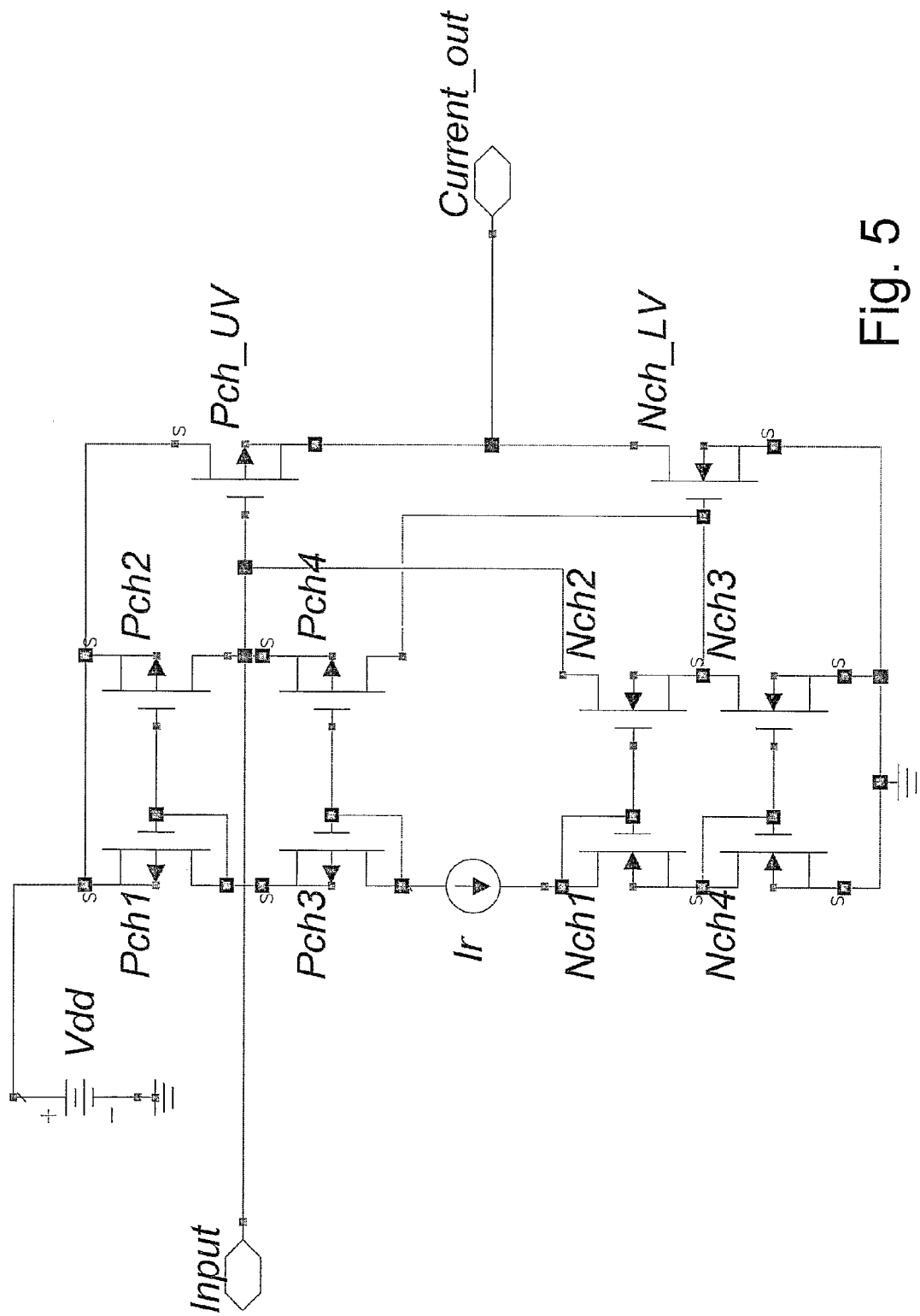
FIG. 5 schematically illustrates a modification of the discrete implementation, for eliminating the need for DC-coupling, according to a preferred embodiment of the invention.
Figure 6:
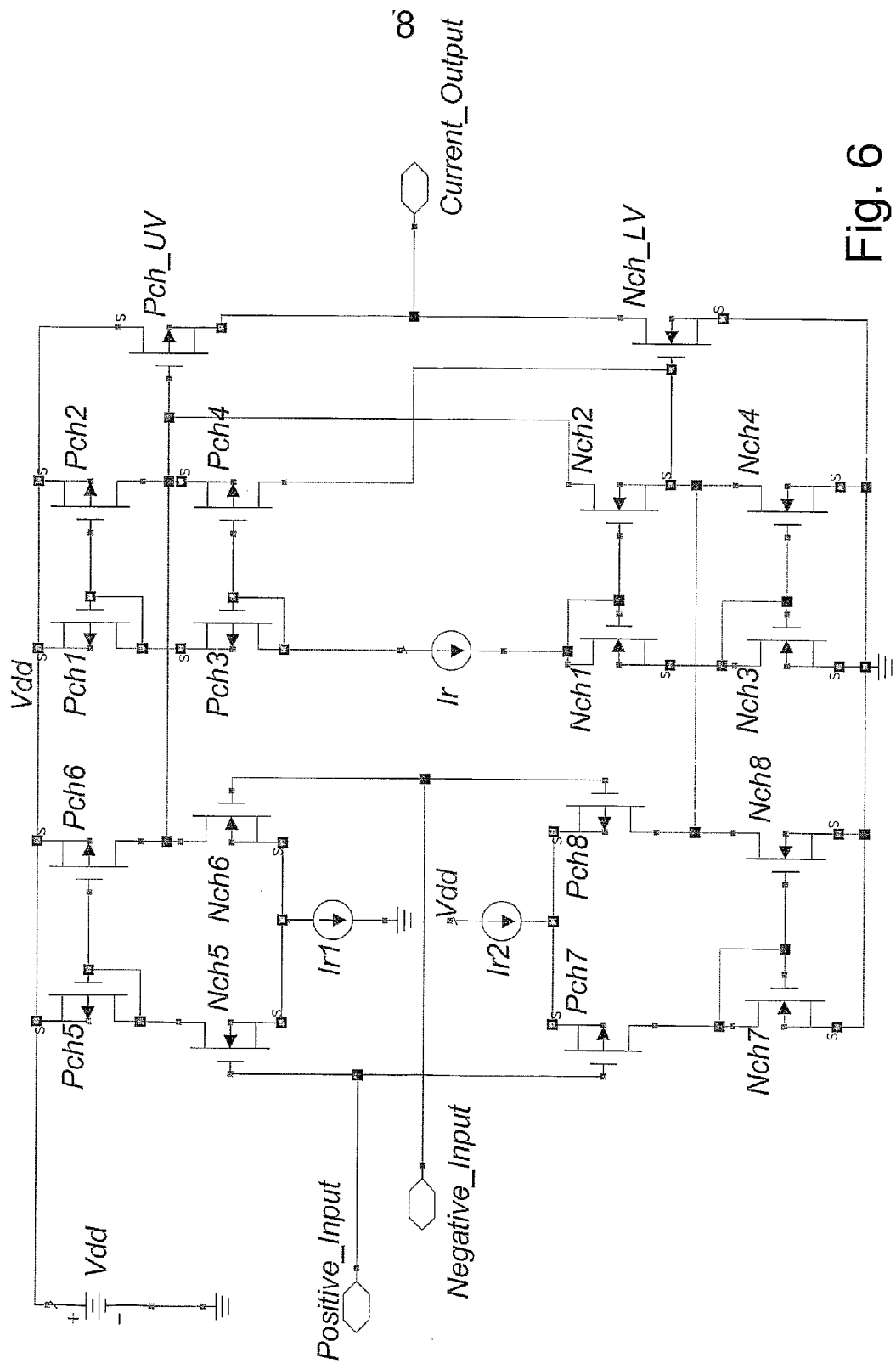
FIG. 6 schematically illustrates another implementation for driving the P-channel and the N-channel output devices with two fast drive paths, according to a preferred embodiment of the invention.

FIG. 5 and FIG. 6 are conceptual implementations of the bias shifting. FIG. 5 illustrates a modification of the discrete implementation, for eliminating the need for DC-coupling, according to a preferred embodiment of the invention. Furthermore, the valves' idle current was made well controlled and internal feedback was inserted to move the N-channel lower valve (LV) from the gate of the P-channel. In addition, the gain of the internal circuit was increased by placing a replica current source driving the P-channel Upper Valve (UV).

FIG. 6 illustrates a second approach for driving the P-channel and the N-channel output devices with two fast drive paths to reduce the response time, according to a preferred embodiment of the invention. This design consumes more power but will be better controlled because the open loop gain is higher, thereby causing smaller variations in the total gain.

The VEC™ Driver

The VEC™ driver is the core of the VEC™ circuit. It contains a push-pull stage that enhances the voltage upon demand and supplies the extra current needed to the PA during the enhancement period. The lower transistor, called the Lower Valve (LV), is usually implemented by using an N-type FET transistor. The upper transistor, in that configuration, may be implemented by using any kind of transistor: N-Type or P-Type Bipolar transistor a FET. Alternatively, it can be even omitted. One major difference between the VEC™ driver output stage and conventional push-pull configuration is that the VEC™ driver has a very low output resistance ($Rds_{on}$) while in inactive mode. This resistance is changing linearly with the input control signal while entering into the active mode above a certain threshold. This feature is necessary to ensure a proper DC supply voltage to the PA when the VEC™ is inactive in order to limit the memory effect.

Figure 7:
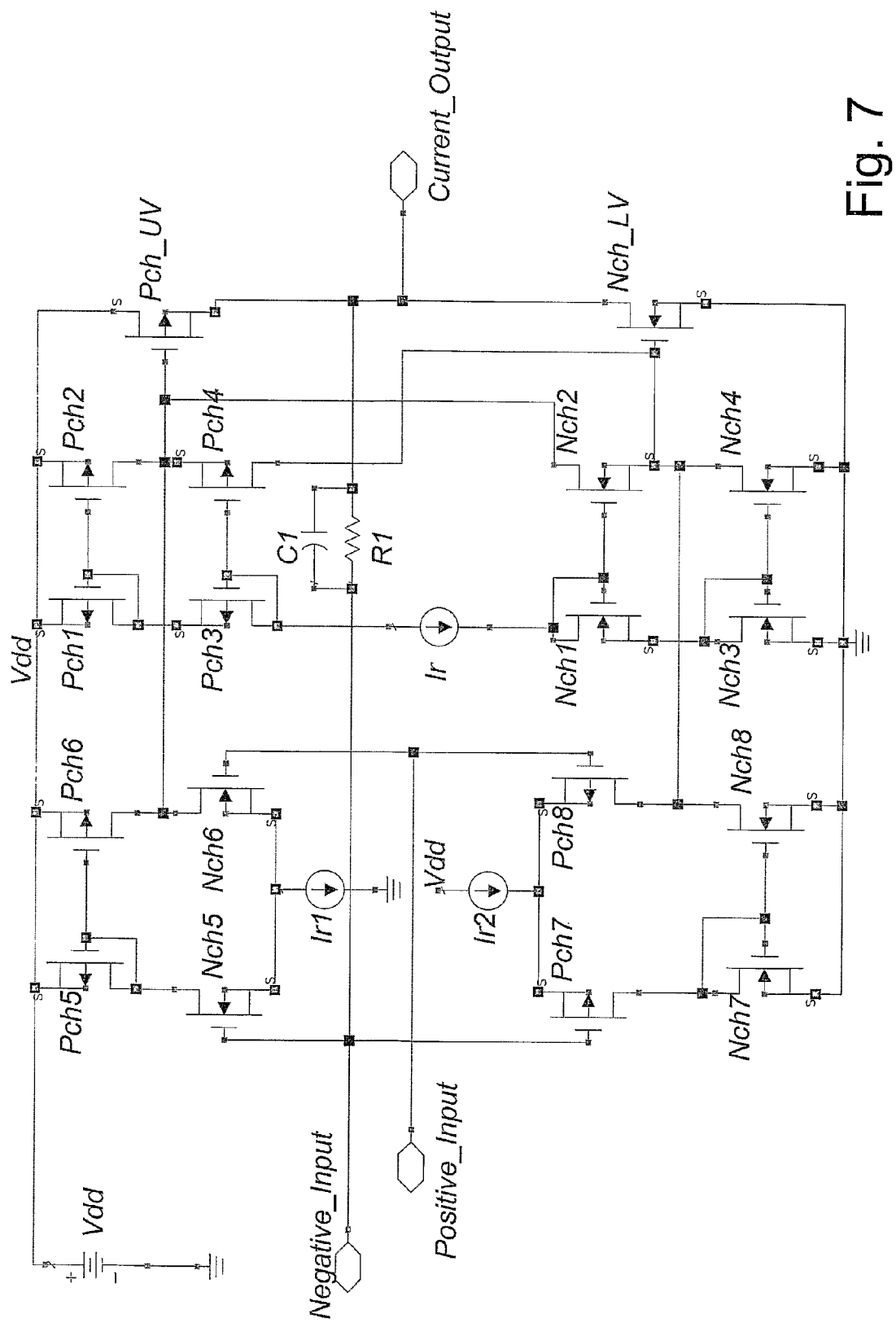
FIG. 7 schematically illustrates an of the VEC™ driver, according to a preferred embodiment of the invention.

FIG. 7 describes a possible implementation of the VEC™ driver, according to a preferred embodiment of the invention. A feedback circuitry is added to ensure switching between two modes: below and above threshold. Below threshold, the feedback is not employed and the VEC™ driver output is shorted to ground through an N-Channel MOS transistor. Above the threshold, the VEC™ is changing mode to a linear amplifier, during which the feedback is employed and the output tracks the input stimulus. Possible feedback configurations are feedback from the PA's drain to the input of the VEC™ driver or feedback from the VEC™ output to the I-booster.

Figure 8:
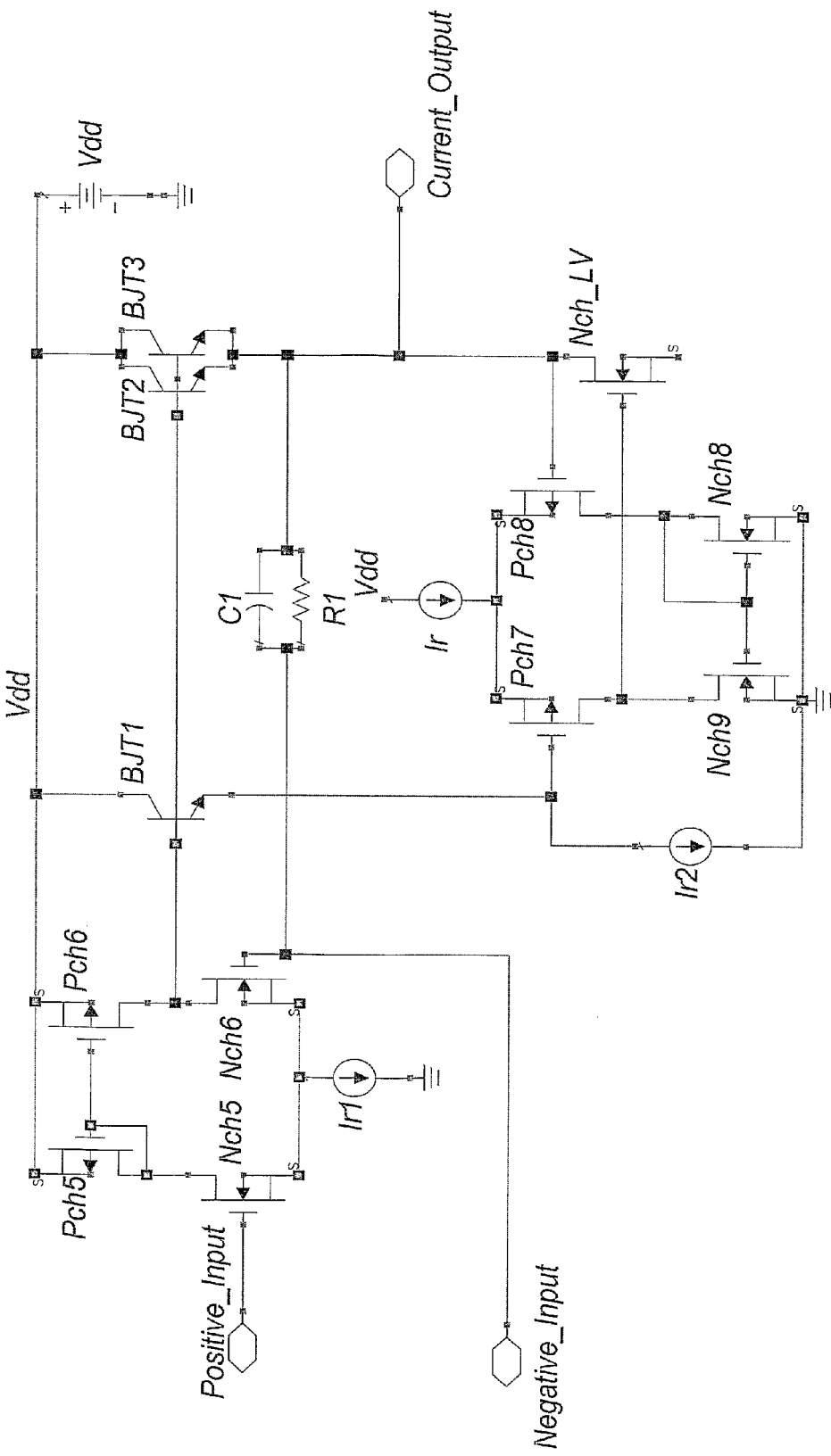
FIG. 8 schematically illustrates an implementation of an N-Type Upper Valve (UV), according to a preferred embodiment of the invention.

FIG. 8 shows an implementation of an N-Type Upper Valve (UV), according to a preferred embodiment of the invention. This driver may be implemented by using BiCMOS process. The feedback is modified to track the changes. The feedback components R1 and C1 are implemented external to the chip, in order to enable better control of the VEC™ gain.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A Voltage Enhancement Circuitry (VEC) for amplifiers, suitable of being implemented as an Integrated Circuit (IC), comprising:

a) a push-pull stage for enhancing the output voltage of said VEC upon demand and for supplying an extra current needed by said amplifier during an enhancement period that is controlled via an input control signal;
b) a VEC driver having a low output resistance (Rdson) while being in its inactive mode and a linearly increasing resistance which is changing linearly with said input control signal, while entering into its active mode, above a determined threshold;
c) IC contacts for connecting a feedback circuitry between the output stage of said VEC and an input of said VEC;
d) the feedback circuitry, being external to said IC, for generating a feedback signal from said output voltage to an input of said VEC driver, for sensing changes in said output voltage;
e) a threshold programming module, for externally programming and determining a threshold level for said input control signal, above which enhancement is provided for shaping the amplified video envelope of said output voltage;
f) an I-Boost module for sampling the current of said input control signal and for amplifying said current up to a pre-defined level; and
g) a current controlled bias circuit for shifting, whenever required, the bias of said push-pull stage.

2. Circuitry according to claim 1, further comprising a coupling capacitor and an RF transformer, through which an enhancement power is fed to DC feeding input of the amplifier.

3. Circuitry according to claim 2, further comprising apparatus for feeding enhancement power to the transformer's primary port through a DC/DC converter and a DC/DC filter.

4. Circuitry according to claim 1, in which the threshold programming module further comprises contacts for connecting an external resistor or a programmable current source, for externally adjusting the threshold level.

5. Circuitry according to claim 1, wherein the feedback circuitry consisting of a combination of parallelly connected capacitor and resistor, for controlling the gain of said. VEC driver by tracking changes in the level of enhancement.

6. Circuitry according to claim 1, in which the feedback circuitry is implemented externally to the IC.

7. Circuitry according to claim 1, in which the VEC driver further comprises two separate fast drive circuits for driving its Lower and Upper Valves through two separate fast drive paths, thereby reducing the response time of said VEC driver with an improved control of the gain of the VEC.

* * * * *